United States Patent
Stickle et al.

(10) Patent No.: US 10,837,998 B1
(45) Date of Patent: Nov. 17, 2020

(54) MINIATURE NONLINEAR TRANSMISSION LINE (NLTL)-BASED FREQUENCY-SCALABLE ULTRA-WIDEBAND SPECTRUM ANALYZER

(71) Applicant: ANRITSU COMPANY, Morgan Hill, CA (US)

(72) Inventors: Kyle Stickle, Los Gatos, CA (US); Karam Noujeim, Los Altos, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 183 days.

(21) Appl. No.: 16/024,553

(22) Filed: Jun. 29, 2018

Related U.S. Application Data

(60) Provisional application No. 62/527,966, filed on Jun. 30, 2017.

(51) Int. Cl.
    *G01R 31/28* (2006.01)

(52) U.S. Cl.
    CPC ..... *G01R 31/2822* (2013.01); *G01R 31/2851* (2013.01)

(58) Field of Classification Search
    CPC ........ G01R 19/17; G01R 27/26; G01R 27/28; G01R 27/32; G01R 31/28; G01R 31/2822; G01R 31/2851; G01R 31/319
    See application file for complete search history.

(56) References Cited

U.S. PATENT DOCUMENTS

| | | | |
|---|---|---|---|
| 2006/0152232 A1* | 7/2006 | Shvets | G01R 31/2822 324/750.02 |
| 2006/0164104 A1* | 7/2006 | Tada | G01B 15/02 324/646 |
| 2006/0250135 A1 | 11/2006 | Buchwald | |
| 2009/0102491 A1* | 4/2009 | Bessho | G01R 27/28 324/629 |
| 2009/0161743 A1* | 6/2009 | Aboujaoude | H04L 1/20 375/226 |
| 2011/0037667 A1 | 2/2011 | Varjonen | |
| 2011/0306314 A1* | 12/2011 | Noujeim | G01R 31/2841 455/226.1 |
| 2016/0050032 A1 | 2/2016 | Emerson | |

(Continued)

OTHER PUBLICATIONS

"71-76 GHz Millimeter-wave Transceiver System, Revision: 1.2", National Instruments, 2015, 11 pages.

(Continued)

*Primary Examiner* — Son T Le
(74) *Attorney, Agent, or Firm* — Tucker Ellis LLP

(57) ABSTRACT

A spectrum analyzer for measuring an electrical response of a device under test (DUT) includes a test port for receiving radio frequency (RF) signals from the DUT in response to a test signal transmitted to the DUT, a local oscillator (LO) for generating a LO signal, a sampler connected with the LO to receive the LO signal and a receiver connected with the sampler. The sampler includes a non-linear transmission line that generates a sampler signal having a frequency that is a multiple of a frequency of the LO signal, and an input for receiving a RF signal from the test port. When a RF signal from an RF input source is received the sampler outputs an intermediate frequency (IF) signal. The receiver receives the IF signal output of the sampler.

20 Claims, 3 Drawing Sheets

(56) References Cited

U.S. PATENT DOCUMENTS

2018/0152255 A1* 5/2018 Woehrle ............... H04B 17/318

OTHER PUBLICATIONS

"802.11ad Integrated RF Test Solution—Data Sheet", Keysight Technologies, published Feb. 3, 2017, 13 pages.
"Cobaltfx mm-Wave VNA Test & Measurement Solution", Farran Technology, http://www.farran.com/shop/fev_fx/, 5 pages.
Noujeim, et al. "Reduced-Complexity E-Band VNAs with Tethered Far-Reaching Reflectometers", Proceedings of the 46th European Microwave Conference, Oct. 4-6, 2016, 4 pages.
Roberts, et al. "A Compact, Tethered E-Band VNA Reflectometer", 2016 IEEE MTT-S International Microwave Symposium (IMS), May 22-27, 2016, 3 pages.
"Vector Network Analyzer Extenders", http://vadiodes.com/en/products/vector-network-analyzer-extension-modules, 7 pages.
"VectorStar Broadband VNA: ME7838A/E/D", Anritsu Company, https://www.anritsu.com/en-US/test-measurement/products/me7838a, 3 pages.
"VNA Extension Modules", https://www.omlinc.com/products/vna-extension-modules, 2016, 3 pages.
Akmal, M. et al., "An Enhanced Modulated Waveform Measurement System for the Robust Characterization of Microwave Devices under Modulated Excitation", Proceedings of the 6th European Microwave Integrated Circuits Conference, © 2011, Oct. 2011, Manchester, UK, pp. 180-183.
Cunha, Telmo R. et al., "Characterizing Power Amplifier Static AM/PM with Spectrum Analyzer Measurements", IEEE © 2014, 4 pages.
Fager, Christian et al., "Prediction of Smart Antenna Transmitter Characteristics Using a New Behavioral Modeling Approach" IEEE® 2014, 4 pages.
Fager, Christian et al., "Analysis of Nonlinear Distortion in Phased Array Transmitters" 2017 International Workshop on Integrated Nonlinear Microwave and Millmetre-Wave Circuits (INMMiC), Apr. 20-21, 2017, Graz, Austria, 4 pages.
Martens, J. et al., "Towards Faster, Swept, Time-Coherent Transient Network Analyzer Measurements" 86th ARFTG Conf. Dig., Dec. 2015, 4 pages.
Martens, J., "Match correction and linearity effects on wide-bandwidth modulated AM-AM and AM-PM measurements" 2016 EuMW Conf. Dig., Oct. 2016, 4 pages.
Nopchinda, Dhecha et al., "Emulation of Array Coupling Influence on RF Power Amplifiers in a Measurement Setup", IEEE © 2016, 4 pages.
Pedro, Jose Carlos et al., "On the Use of Multitone Techniques for Assessing RF Components' Intermodulation Distortion", IEEE Transactions on Microwave Theory and Techniques, vol. 47, No. 12, Dec. 1999, pp. 2393-2402.
Ribeiro, Diogo C. et al., "D-Parameters: A Novel Framework for Characterization and Behavorial Modeling of Mixed-Signal Systems", IEEE Transactions on Microwave Theory and Techniques, vol. 63, No. 10, Oct. 2015, pp. 3277-3287.
Roblin, Patrick, "Nonlinear RF Circuits and Nonlinear Vector Network Analyzers; Interactive Measurement and Design Techniques", The Cambridge RF and Microwave Engineering Series, Cambridge University Press © 2011, entire book.
Rusek, Fredrik et al., "Scaling Up MIMO; Opportunities and challenges with very large arrays", IEEE Signal Processing Magazine, Jan. 2013, pp. 40-60.
Senic, Damir et al., "Estimating and Reducing Uncertainty in Reverberation-Chamber Characterization at Millimeter-Wave Frequencies", IEEE Transactions on Antennas and Propagation, vol. 64, No. 7, Jul. 2016, pp. 3130-3140.
Senic, Damir et al., "Radiated Power Based on Wave Parameters at Millimeter-wave Frequencies for Integrated Wireless Devices", IEEE © 2016, 4 pages.

* cited by examiner

MINIATURE NONLINEAR TRANSMISSION LINE (NLTL)-BASED FREQUENCY-SCALABLE ULTRA-WIDEBAND SPECTRUM ANALYZER

CLAIM OF PRIORITY

This application claims the benefit of priority to U.S. Provisional Application titled "MINIATURE NONLINEAR TRANSMISSION LINE (NLTL)-BASED FREQUENCY-SCALABLE ULTRA-WIDEBAND SPECTRUM ANALYZER", Application No. 62/527,966, filed Jun. 30, 2017, which application is herein incorporated by reference.

TECHNICAL FIELD

The present invention relates generally to systems, devices and methods of measuring an electrical response of a device under test (DUT) to test signals.

BACKGROUND

Signal frequencies in the millimeter (mm)-wave spectrum (e.g. V Band, E Band, W Band, etc.) have been in use in military applications as well as a growing number of consumer applications. For example, automotive electronic safety systems, such as collision-avoidance radar systems operate at frequencies from the mm-wave spectrum. Further, the allocation of mm-wave bands for upcoming fifth-generation (5G) cellular wireless communications systems is expected to vastly increase the use of available wide bandwidths in support of communications and entertainment services to be offered to consumers by service providers.

Millimeter wave frequencies offer untapped bandwidth for many different applications. An important part of achieving mm-wave solutions includes the capability to test performance levels at such high frequencies, both for a device under test (DUT) and its operating environment. Testing these higher-frequency mm-wave frequency systems requires suitable test equipment, including spectrum analyzers with not only sufficient frequency range but also sufficient acquisition bandwidth. Current solutions for spectrum analyzer measurements at mm-wave frequencies are either expensive, bulky, heavy, unwieldy, limited in physical reach, complex, or combinations thereof.

BRIEF DESCRIPTION OF THE DRAWINGS

Further details of the present invention are explained with the help of the attached drawings in which.

DETAILED DESCRIPTION

Figure 1:
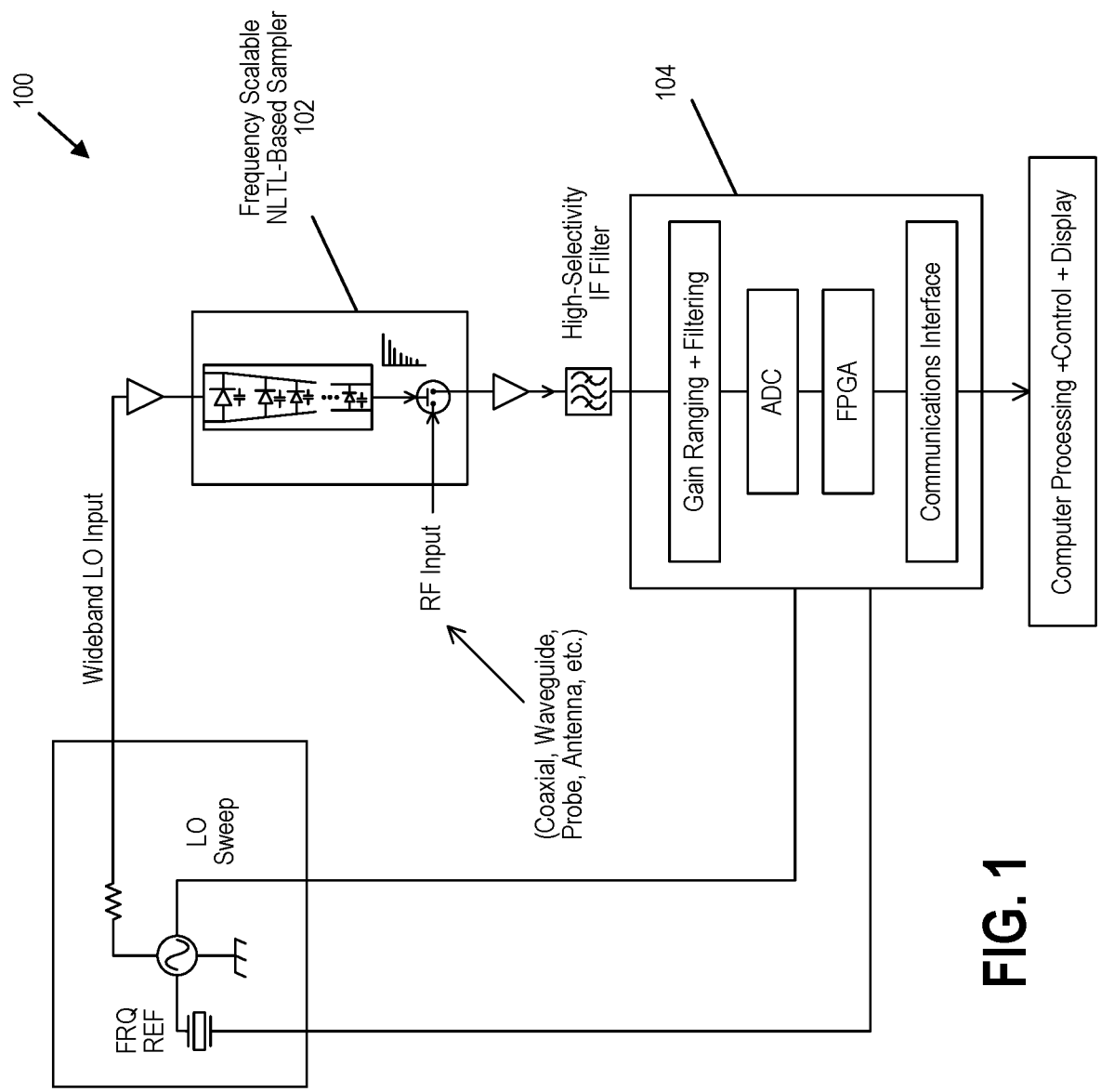
FIG. 1 is a circuit diagram of a spectrum analyzer, in accordance with an embodiment.

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

In the description of the invention that follows, like numerals or reference designators will be used to refer to like parts or elements throughout.

In the following description, numerous specific details are set forth to provide a thorough description of the invention. However, it will be apparent to those skilled in the art that the invention may be practiced without these specific details. In other instances, well-known features have not been described in detail so as not to obscure the invention.

Spectrum analyzers are used for a variety of applications. Spectrum analyzers are widely used to measure the frequency response, noise and distortion characteristics of radio-frequency (RF) circuitry by comparing the input and output spectra. For example, in RF mixers, a spectrum analyzer can be used to identify the levels of third order inter-modulation products and conversion loss. In RF oscillators, a spectrum analyzer can be used to find the levels of different harmonics. In telecommunications, a spectrum analyzer can be used to determine occupied bandwidth and track interference sources. A spectrum analyzer can be used to determine whether a wireless transmitter s working according to defined standards for purity of emissions. A spectrum analyzer can also used to determine, by direct observation, the bandwidth of a digital or analog signal.

Unlike conventional spectrum analyzers which are mixer based, embodiments of the present invention makes use of a frequency-scalable nonlinear transmission line (NLTL)-based sampling receiver to miniaturize the spectrum analyzer and achieve ultra-wideband performance. Embodiments also make us of field-programmable gate array (FPGA)-based algorithms for radio frequency (RF) image suppression and mathematical/digital signal processing (DSP).

Embodiments comprising NLTL-based sampling receivers are used, for example, in the MS2760A series of products available from Anritsu Company. Further, embodiments comprising NLTL-sampling receivers can be used in conjunction with vector network analyzers (VNA), such as those available from Anritsu Company, for example the VectorStar 4 Port Broadband VNA model ME7838A4, as well as in potential original equipment manufacturer (OEM) systems.

Embodiments of the invention can provide a thermally efficient, frequency scalable, ultra-wideband spectrum analyzer in a miniature form factor, for example operating in the frequency range of 9 KHz-110 GHz and having a size of approximately 84 mm×155 mm×27 mm. Features of embodiments of the invention include the use of NLTL receiver technology for ultra-wideband performance, miniaturization, and frequency scalability, FPGA-based image-rejection, processing, and calibration algorithms, reduced mm-wave hardware cost and complexity, and the use of ultra-wideband planar-coaxial transitions.

FIG. 1 illustrates a circuit diagram for a measuring instrument comprising a spectrum analyzer 100, in accordance with an embodiment. As shown, a reference crystal oscillator generates an oscillation signal at a reference frequency (FRQ REF) for use by a local oscillation (LO) signal source. The LO signal source provides a wideband LO input to a frequency scalable, NLTL-based sampler 102. In an embodiment, the LO signal can comprise a square wave. The NLTL multiplies the frequency of the LO signal to mm-wave frequencies. The output of the NLTL is connected with an RF input, for example a signal received from a device under test (DUT) via a coaxial cable, a waveguide, a probe, an antenna, etc. The output of the NLTL and the RF input produce an intermediate frequency (IF) signal, that is amplified and filtered and provided to a receiver 104 of the spectrum analyzer. The LO signal source also provide an LO signal to the receiver as a reference.

The IF signal at the receiver is processed by a gain ranging and filtering component, converted from analog to digital via an analog-to-digital converter (ADC), and processed via a FPGA processor and sent to a computer via a communication interface for computer processing of the results and display. The communication interface can optionally be used for controlling the spectrum analyzer for commanding and controlling frequency sweeps.

The NLTL-based sampler enables construction of receiver circuitry covering frequencies from audio through millimeter waves with excellent amplitude accuracy and with amplitude flatness that remains typically within ±1 dB, even for a near-110-GHz frequency range.

Figure 2:
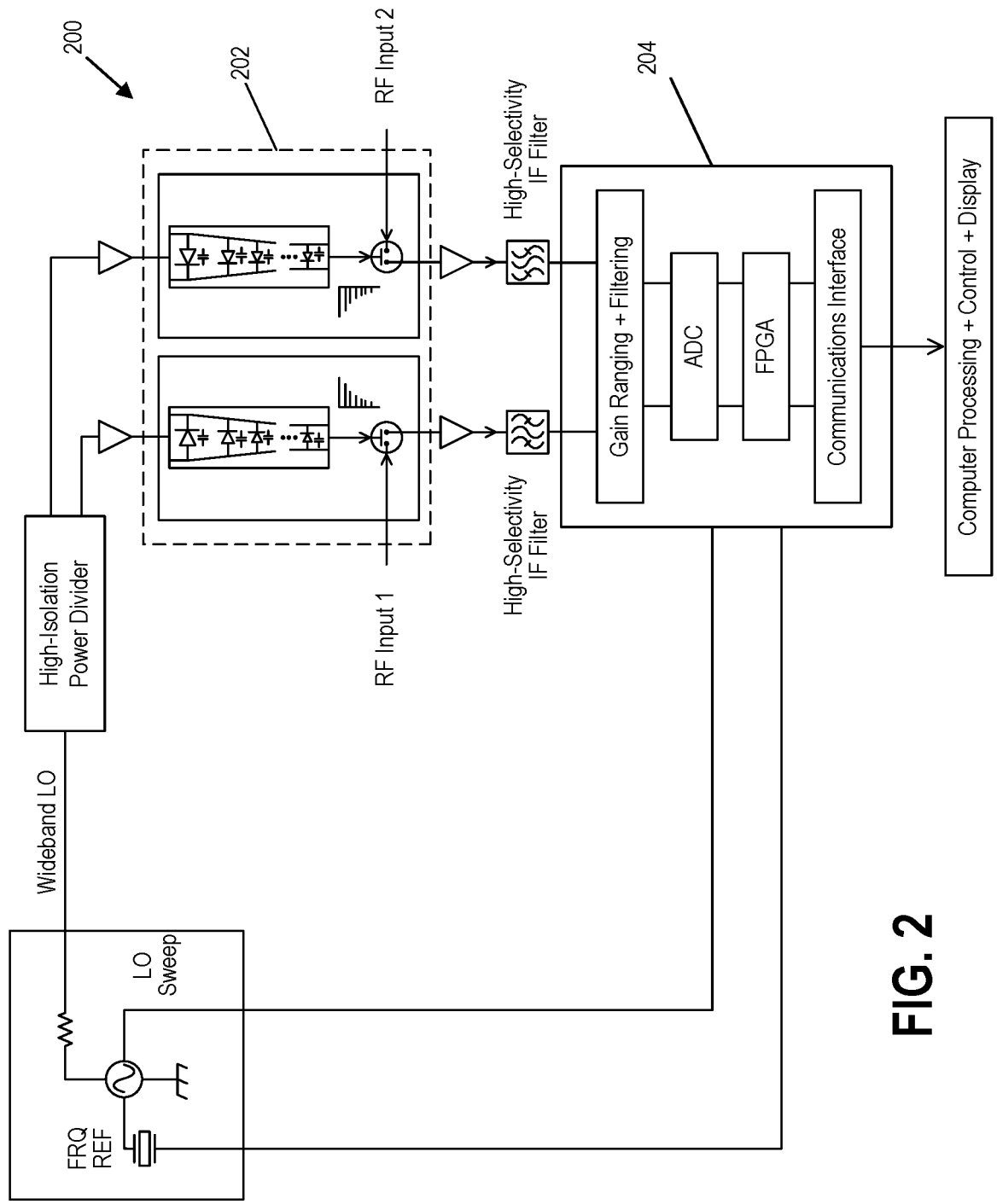
FIG. 2 is a circuit diagram of a spectrum analyzer, in accordance with another embodiment.

FIG. 2 illustrates a circuit diagram for a measuring instrument comprising a spectrum analyzer 200 having two test ports, in accordance with a further embodiment. As shown, a reference crystal oscillator creates an oscillation signal at a reference frequency (FRQ REF) for use by a local oscillation (LO) signal source. The LO signal source provides a wideband LO input to a pair of frequency scalable, NLTL-based samplers 202. In an embodiment, the LO signal can comprise a square wave. The LO signal can be divided and isolated via a high isolation power divider and separately provided to each of the NLTL-based samplers. The output of the first NLTL is connected with a first RF input (RF input 1) and the output of the second NLTL is connected with a second RF input (RF input 2). The outputs of the NLTLs and the RF input produce a first IF signal and a second IF second that are each amplified and filtered and provided to a receiver 204. The LO signal source also provide an LO signal to the receiver as a reference.

The IF signals at the receiver are processed by a gain ranging and filtering component, converted from analog to digital via an analog-to-digital converter (ADC), and processed via a FPGA processor and sent to a computer via a communication interface for computer processing of the results and display. The communication interface can optionally be used for controlling the spectrum analyzer for commanding and controlling frequency sweeps.

Signal power tends to decrease with increasing frequency, with conventional mixer-based technologies exhibiting losses that increase with rising frequencies. The nonlinear characteristics of the NLTL circuits enables them to achieve flat amplitude response over such wide frequency spans.

The consistent frequency response and wide dynamic range of the internal receiver and its transmission lines are preserved in the coaxial realm by means of a wideband planar-to-coaxial transition, terminating in different test port connectors depending on the frequency range of the particular spectrum analyzer.

Embodiments of spectrum analyzers comprising NLTL-based samples are small enough to connect directly to a DUT to eliminate the need for lossy, expensive interconnecting cables at millimeter-wave frequencies.

For operation to 70 GHz, for example, 1.85-mm V-connectors (named for their V band frequency range) are used. In regards to the highest-frequency model, 1-mm coaxial connectors enable connections to DUTs, antennas, and other measurement accessories operating at frequencies to 110 GHz. Models operating to 32 and 44 GHz use 2.92-mm K connectors.

Depending on the choice of frequency range, the small (e.g., pocket) sized spectrum analyzers are usable for high-frequency measurements in commercial, industrial, and military markets, including for automotive safety systems, military electronic-warfare (EW) systems, microwave radios, and satellite-communications (satcom) systems. The small size and versatility of the analyzers can encourage production and esearch environments to operate with multiple test stations. In research environments, this can result in a more thorough investigation of a new design or technology. In production, this can result in more products that are ready to ship.

In addition to production-line measurements needed to supply the hardware requirements of mm-wave applications, on-site testing is necessary for qualification and maintenance of wireless communications networks employing mm-wave frequencies. Due to the short-range propagation of mm-wave signals and their attenuation by buildings and other obstacles, wireless communications coverage with mm-wave frequencies 1 require large numbers of antennas and antenna arrays and possibly multiple-input, multiple-output (MIMO) techniques for the best use of maintaining signal coverage.

Having small sized, battery powered analyzers capable of characterizing high-frequency networks and associated antennas provides movable test benches for wireless network technicians. With small size mm-wave spectrum analyzer, test instruments can be connected directly to a DUT, such as an antenna, for simplified testing. The loss (and cost) of interconnecting mm-wave coaxial cables can be eliminated from the measurement setup.

In accordance with an embodiment, measuring instruments can be controlled remotely by small computer peripheral interface (SCPI) via a universal serial bus (USB) connection. Spectrum analyzers provide a number of "smart" measurements, including channel power, adjacent channel power, and occupied bandwidth.

A spectrum analyzer in accordance with embodiments can tune frequency with resolution of 1 kHz across their different frequency ranges. Measurements can be made with resolution bandwidths (RBWs) and video bandwidths (VBWs) from 10 Hz to 3 MHz and with sweep speeds approaching 7 s for a near-70-GHz span. Reference levels can be set from −120 to +30 dBm, with maximum safe input power as high as +20 dBm. The displayed average noise level (DANL) is typically −132 dBm from 40 to 70 GHz and −134 dBm or better for most of the frequency range below that. The DANL is typically better than −127 dBm through 110 GHz.

Such analyzers can operate with very good spectral purity, with typical spurious levels of −95 dBc and worse-case spurious levels of −85 dBc. Second-harmonic performance measured for a 1-GHz input signal at 0 dBm is typically −60 dBc, with maximum second-harmonic level of −60 dBc for a 1-GHz input signal at an input level of −20 dBm. The coaxial input is well matched to 50Ω, with a typical VSWR of 1.29:1 to 12.4 GHz (18-dB return loss), 1.43:1 to 26.5 GHz (15-dB return loss), 1.58:1 to 40 GHz (13-dB return loss), and 2.10:1 to 70 GHz (9-dB return loss).

Spectrum analyzers available from Anritsu Company in the mm-wave frequency range are equipped with a USB 3.0 Type C connector from which they are completely powered by the host controller. The analyzers feature an internal frequency reference with ±1-ppm/year aging rate and ±0.2-ppm frequency accuracy, as well as input/output connections for an external 10-MHz reference source. For infield measurements, the performance levels of the spectrum analyzers apply to temperatures from −10 to +50° C.

Figure 3A:
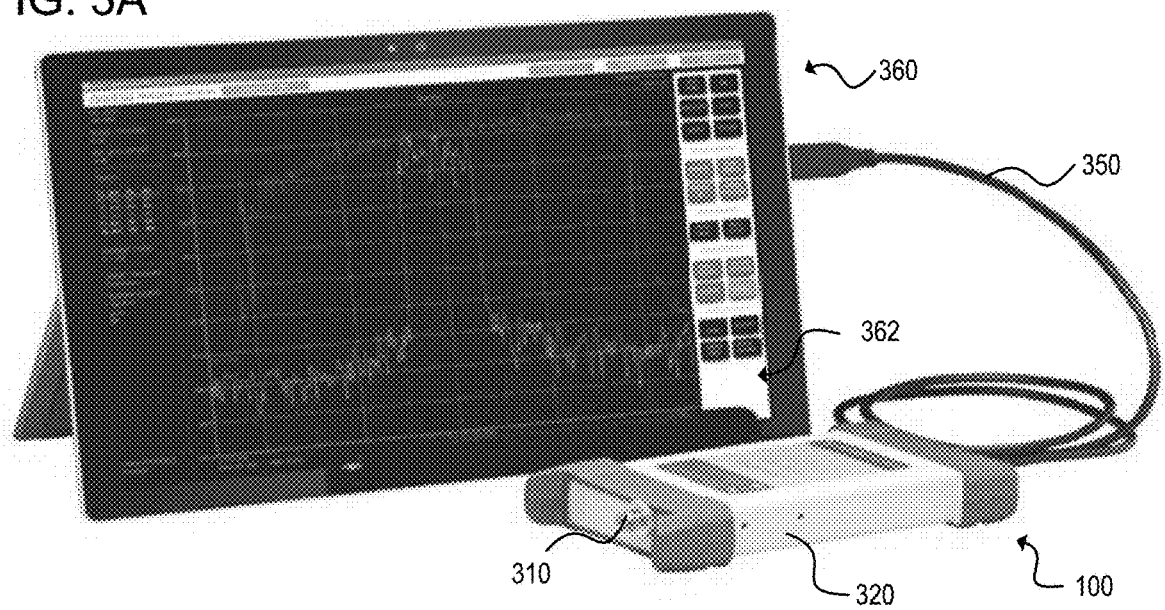
FIGS. 3A-3C show external views of the spectrum analyzer of FIG. 1, in accordance with an embodiment.
Figure 3B:
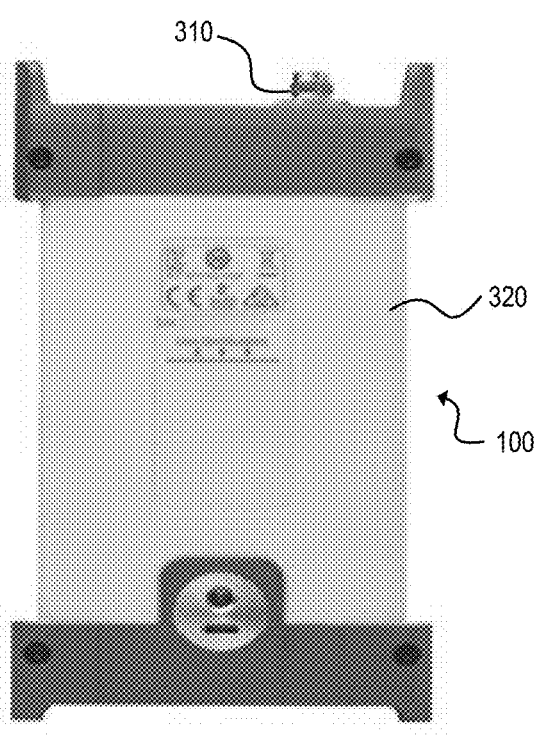
Figure 3C:
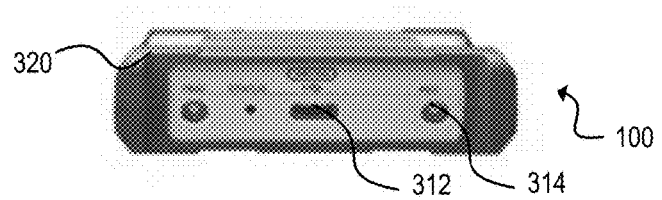

FIGS. 3A-3C show external views of the spectrum analyzer of FIG. 1, in accordance with an embodiment. As shown in FIGS. 3A-3C, the spectrum analyzer 100 is constructed in a small housing 320. In an embodiment, housing 320 is 55 mm×84 mm×27 mm and spectrum analyzer 100 weighs 225g. The ultraportable form factor enable measurements right at the DUT. An RF connector 310 is provided on one end of housing 320 for connecting the spectrum analyzer 100 to a DUT. RF connector 310 is one of a K(m) connector, a V(m) connector or W(m) connector. A USB-C port 312 is provided at the other end of housing 320 (See FIG. 3C). A 10 MHz frequency reference input 314 is also provided. Various models of the spectrum analyzer can be provided for different frequency ranges, for example 9 khz-32 GHz, 9 kHz-44 Ghz, 9 kHz-50 Ghz, 9 kHz-70 Ghz, 9 kHz-90 Ghz, 9 kHz-44 Ghz, 9 kHz-110 Ghz.

A USB-C cable 350 connects spectrum analyzer 100 to computer 360. Computer 360 provides power and control inputs to spectrum analyzer 100 via USB-C cable 350. Computer 360 receives DUT measurement data from spectrum analyzer 100 via USB-C cable 350. Computer 360 displays DUT measurement data on display 362. In an embodiment computer 360 is a portable WINDOWS® computer, for example a tablet having a USB-C port for interfacing with spectrum analyzer 100.

In some embodiments, the present invention includes a computer program product which is a storage medium or computer readable medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMS, EPROMs, EEPROMs, DRAMs, VRAMs, flash memory devices, magnetic or optical cards, nanosystems (including molecular memory ICs), or any type of media or device suitable for storing instructions and/or data.

The previous description of the preferred embodiments is provided to enable any person skilled in the art to make or use the embodiments of the present invention. While the invention has been particularly shown and described with reference to preferred embodiments thereof, it will be understood by those skilled in the art that various changes in form and details may be made therein without departing from the spirit and scope of the invention.

The invention claimed is:

1. A spectrum analyzer for measuring an electrical response of a device under test (DUT), comprising:
a housing;
a USB-C port on a surface of the housing for interfacing with a computer system via a USB-C cable from which the spectrum analyzer is powered;
a test port on a surface of the housing for receiving radio frequency (RF) signals from the DUT in response to a test signal transmitted to the DUT;
a local oscillator within the housing (LO) for generating a LO signal;
a sampler within the housing connected with the LO to receive the LO signal, the sampler including
a non-linear transmission line that generates a sampler signal having a frequency that is a multiple of a frequency of the LO signal, and
an input for receiving the RF signals from the DUT via the test port,
wherein, when the RF signals are received, the sampler outputs an intermediate frequency (IF) signal; and
an amplifier and high-selectivity filter within the housing;
a receiver within the housing connected with the sampler to receive the IF signal output of the sampler via the amplifier and the high-selectivity filter;
wherein the receiver comprises a gain ranging and filtering module which filters the IF signal;
wherein the receiver comprises an analog to digital converter module which receives the filtered IF signal and generates a digital signal output;
wherein the receiver comprises a field programmable gate array (FPGA) which performs digital signal processing on the digital signal output to generate processed digital signal output; and
wherein the receiver comprises a communication interface connected to the USB-C port which receives the processed digital signal output and provides it to the computer system via the USB-C cable.

2. The spectrum analyzer of claim 1, wherein the sampler is a first sampler and the test port is a first test port, the spectrum analyzer further comprising:
a second test port for receiving radio frequency (RF) signals from the DUT; and
a second sampler
wherein when RF signals are received from the DUT via the second test port, the sampler outputs a second intermediate frequency (IF) signal; and
wherein the receiver is connected with the second sampler to receive the second IF signal output of the second sampler.

3. The spectrum analyzer of claim 1, wherein the spectrum analyzer is used as a frequency counter.

4. The spectrum analyzer of claim 1, wherein the LO is a variable LO for enhanced displayed average noise level (DANL).

5. The spectrum analyzer of claim 1, further comprising a general-purpose computing on graphics processing units (GPGPU).

6. The spectrum analyzer of claim 1, further comprising a tether connectable between the test port and the DUT.

7. The spectrum analyzer of claim 1, wherein the spectrum analyzer is integrated with an antenna.

8. The spectrum analyzer of claim 1, wherein the spectrum analyzer is integrated with one or more probes for on-wafer chip testing.

9. The spectrum analyzer of claim 1, wherein:
the test port comprises a 1 mm coaxial connector for directly connecting the spectrum analyzer to DUT.

10. The spectrum analyzer of claim 1, wherein:
the spectrum analyzer is configured to analyze frequencies between 9 kHz and 110 GHz.

11. The spectrum analyzer of claim 1, wherein:
the housing is no larger than 84 mm×155 mm×27 mm.

12. The spectrum analyzer of claim 1, wherein:
the communication interface of the receiver is configured to receive controls from the computer system over the USB-C cable for commanding and controlling frequency sweeps.

13. The spectrum analyzer of claim 1, further comprising:
the computer system comprising a display for displaying the processed digital signal output;
and the USB-C cable connecting the computer system and the USB-C port.

14. The spectrum analyzer of claim 1, further comprising:
the computer system comprising, a tablet having a display for displaying the processed digital signal output;
and the USB-C cable connecting the computer system and the USB-C port.

15. A spectrum analyzer system for measuring an electrical response of a device under test (DUT), comprising:
a computer system;
a USB-C cable a compact housing;

a USB-C port on a surface of the housing for interfacing with the computer system via the USB-C cable from which the spectrum analyzer is powered;

a test port on a surface of the housing for receiving radio frequency (RF) signals from the DUT in response to a test signal transmitted to the DUT;

a local oscillator within the housing (LO) for generating a LO signal;

a sampler within the housing connected with the LO to receive the LO signal, the sampler including
  a non-linear transmission line that generates a sampler signal having a frequency that is a multiple of a frequency of the LO signal, and
  an input for receiving the RF signals from the DUT via the test port,
  wherein, when the RF signals are received, the sampler outputs an intermediate frequency (IF) signal; and an amplifier and high-selectivity filter within the housing;

a receiver within the housing connected with the sampler to receive the IF signal output of the sampler via the amplifier and the high-selectivity filter;

wherein the receiver comprises a gain ranging and filtering module which filters the IF signal;

wherein the receiver comprises an analog to digital converter module which receives the filtered IF signal and generates a digital signal output;

wherein the receiver comprises a field programmable gate array (FPGA) which performs digital signal processing on the digital signal output to generate processed digital signal output; and wherein the receiver comprises a communication interface connected to the USB-C port which receives the processed digital signal output and provides it to the computer system via the USB-C cable.

16. The spectrum analyzer system of claim 15, further comprising:
  another test port for receiving radio frequency (RF) signals from the DUT; and
  another sampler wherein when RF signals are received from the DUT via the second test port, the another sampler outputs a another intermediate frequency (IF) signal to the receiver.

17. The spectrum analyzer system of claim 15, further comprising a wideband planar-to-coaxial transition between the sampler and the test port.

18. The spectrum analyzer system of claim 15, wherein:
the test port comprises a 1 mm coaxial connector for directly connecting the spectrum analyzer to DUT.

19. The spectrum analyzer of claim 15, wherein:
the communication interface of the receiver is configured to receive controls from the computer system over the USB-C cable for commanding and controlling frequency sweeps.

20. The spectrum analyzer system of claim 15, wherein:
the computer system comprises a tablet having a display for displaying the processed digital signal output; and
the communication interface of the receiver is configured to receive controls from the tablet over the USB-C cable for commanding and controlling frequency sweeps.

* * * * *